United States Patent [19]

Washburn, Jr.

[11] 4,242,649

[45] Dec. 30, 1980

[54] METHOD AND APPARATUS FOR MODULATING A PHASE LOCKED LOOP

[75] Inventor: Clyde Washburn, Jr., Fairport, N.Y.

[73] Assignee: Harris Corporation, Melbourne, Fla.

[21] Appl. No.: 57,281

[22] Filed: Jul. 13, 1979

[51] Int. Cl.³ .......................... H03C 3/08; H03C 3/09
[52] U.S. Cl. ....................................... 332/18; 331/23;
 331/25; 332/19
[58] Field of Search .......................... 332/18, 19, 30 V;
 331/23; 455/110, 113, 119

[56] References Cited

U.S. PATENT DOCUMENTS

| | | | |
|---|---|---|---|
| 3,414,842 | 12/1968 | Broadhead, Jr. | 332/19 |
| 3,810,046 | 5/1974 | Lance | 332/19 |
| 4,052,672 | 10/1977 | Enderby et al. | 332/19 X |

FOREIGN PATENT DOCUMENTS 2348650  4/1975  Fed. Rep. of Germany ............. 332/19

*Primary Examiner*—Siegfried H. Grimm
*Attorney, Agent, or Firm*—L. Lawton Rogers, III

[57] ABSTRACT

A phase locked loop provides frequency modulation over an extended frequency range by summing a modulation signal with the loop signal at two separate points within the loop. The modulation signal is directly applied to the control input terminal of the voltage controlled oscillator. In addition, the modulation signal is processed to compensate for the transfer functions of loop components, and the processed signal is summed with the loop signal at an additional point between the output terminals of the phase detector and the lowpass filter of the loop. The processing of the modulation signal consists of preshaping of the signal to compensate for the transfer functions of loop circuitry located between the voltage controlled oscillator and the summing junction.

9 Claims, 9 Drawing Figures

METHOD AND APPARATUS FOR MODULATING A PHASE LOCKED LOOP

BACKGROUND OF THE INVENTION

The present invention relates to a method and apparatus for modulating phase locked loops, and more particularly to a method and apparatus of this type in which the frequency range of modulation of the phase locked loop is extended substantially over that of prior art modulation techniques.

In general, a phase locked loop includes a voltage controlled oscillator and a source of a reference signal. A phase detector compares a component of the reference signal, i.e., phase, with the same component of the output signal from the voltage controlled oscillator. The phase detector produces an output signal related to the difference in the compared components of the two signals. This output signal is processed in a loop filter, for example a lowpass filter, and the processed signal is applied to an input terminal of the voltage controlled oscillator to control the frequency of the output signal from the oscillator. In the past, modulation of the phase locked loop, i.e., modulation of the output signal from the voltage controlled oscillator, was accomplished by applying a modulation signal to one or both of two points in the phase locked loop.

In a first prior art technique for modulating the phase locked loop, the reference signal is modulated. The modulation response of the phase locked loop for this type of modulation has a transfer function $H(\omega)$ which is relatively flat, i.e., constant, for low frequencies up to approximately the natural or resonant frequency of the phase locked loop. However, the transfer function decreases rapidly at approximately the natural frequency of the loop and it is therefore generally impractical to use this method of modulation for frequencies greater than the natural frequency of the loop, in view of the rapidly decreasing loop response at these frequencies.

In a second method of modulating phase locked loops, the modulation signal is summed with the control input signal to the voltage controlled oscillator. The modulation response of the loop for this type of modulation can be defined as $1-H(\omega)$, which is relatively flat for frequencies greater than the natural frequency of the loop. However, this transfer function decreases rapidly for frequencies less than the natural frequency. Previous attempts to extend the low frequency response range using this modulation technique have employed preemphasis circuits which amplify the modulating signal to compensate for loop attenuation of the modulation. If the phase locked loop utilizes complex loop filters to provide large amounts of reference frequency attenuation, the required modulation compensation circuit is very complex and difficult to align with the loop response to provide a flat net modulation response.

A proposed solution for extending the frequency range of the modulation of a phase locked loop is disclosed in U.S. Pat. No. 4,052,672, issued to Enderby et al. In the phase locked loop disclosed in that patent, a modulation signal is directly summed with the input signal to the voltage controlled oscillator, and thus provides substantially linear high frequency modulation response in accordance with the previously desribed prior art technique. In addition, the modulation signal is integrated and the integrated signal is summed with the output signal from the phase detector of the loop. This integration is performed to compensate for the fact that the phase locked loop has a low frequency transfer function which approximates that of a differentiator. The integration of the modulation signal cancels out the differentiation response of the phase locked loop and provides substantially linear modulation response at low frequencies. However, the modulation technique disclosed in the Enderby et al. patent does not provide for linear modulation response in the mid-frequency range. This problem is due in large part to the parasitic or non-linear frequency and phase response effects of the phase detector and other loop circuitry located ahead of the point at which the integrated modulation signal is added to the loop signal. In other words, the proposed solution of the Enderby patent is applicable only to phase locked loops utilizing ideal phase detectors, i.e., those providing a transfer function $K/j\omega$ for all frequencies.

One common application of a modulated phase locked loop is as a frequency synthesizer. The industry trend today is towards frequency synthesizers having relatively low sideband noise levels. The lowering of the noise level in the output signal of the frequency synthesizer by increasing the phase detector gain constant is frequently accompanied by an increase in the parasitic effects of the phase detector and other loop components. The proposed solution of the Enderby et al patent is not suitable for use in relatively low noise frequency synthesizers having increased phase detector and loop filter parasitic effects.

In addition, the proposed solution of the Enderby et al patent is further limited in that the integrated modulation signal can only be summed with the loop signal at a junction between the phase detector and the loop filter. The signal cannot be added to other points in the loop since the integration technique alone is not capable of accounting for modulation response of the loop if a signal is added at other points. This limitation presents a drawback in that undesirable circuit partitioning may result from arranging the phase locked loop to accommodate the addition of the integrated modulation signal at this point. For example, if the phase locked loop is incorporated in an integrated circuit, it may be necessary to add a number of extra pins to the integrated circuit to allow the signal to be added at the desired junction. Among other factors, the need to provide additional pins results in increased manufacturing costs.

OBJECTS OF THE INVENTION

It is therefore an object of the present invention to provide a novel method and apparatus for modulating a phase locked loop which achieves better linearity of the modulation response of the loop in the mid-frequency range.

It is another object of the invention to provide a novel method and apparatus for modulating a phase locked loop which is able to compensate for the parasitic effects of the loop and can thereby be incorporated within a number of different types of loops.

It is a further object of the present invention to provide a novel method and apparatus for modulating phase locked loops which can be utilized in loops employing non-ideal phase detectors.

It is yet another object of the present invention to provide a novel method and apparatus for modulating phase locked loops which provides a choice of junctions at which a modulation signal can be applied to the loop, to thereby decrease manufacturing cost, or improve circuit partitioning.

BRIEF DESCRIPTION OF THE DRAWINGS

These, as well as other objects and advantages of the present invention, will become apparent to one of ordinary skill in the art to which the present invention pertains upon a perusal of the following detailed description of the preferred embodiments of the invention when taken in conjunction with the accompanying drawings, in which.

DETAILED DESCRIPTION

Figure 1:
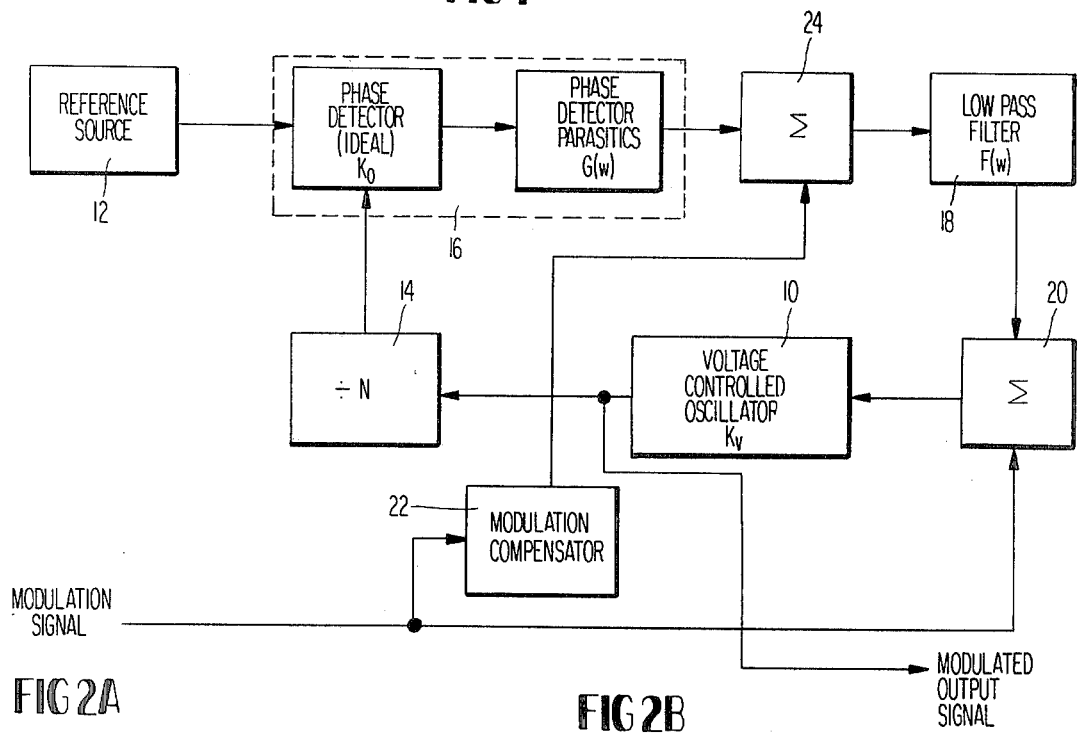
FIG. 1 is a block circuit diagram illustrating a phase locked loop wherein the blocks are respectively labelled with the transfer functions of the components of the loop.

A frequency modulated phase locked loop is illustrated in block diagram form in FIG. 1. The phase locked loop includes a voltage controlled oscillator 10 and a reference signal source 12. The frequency of the output signal from the voltage controlled oscillator 10 is equal to N times the frequency of the reference signal, wherein N is an integer. The frequency of the output signal from the voltage controlled oscillator 10 is divided by N in a frequency divider 14 and fed as an input signal into a phase detector 16. The phase detector 16 compares the phase of the reference signal from the reference source 12 with that of the frequency divided oscillator output signal, and produces an output signal related to the phase difference between the two compared signals. This output signal is processed in a low pass filter 18, and the processed signal is fed as an input signal to the voltage controlled oscillator 10. The amplitude of the output signal from the low pass filter 18 controls the frequency of the output signal from the voltage controlled oscillator 10.

In FIG. 1, the phase detector 16 is illustrated as having two components. The first component of the phase detector 16 is that circuitry which forms an ideal phase detector, i.e., having a transfer function conforming to $K/j\omega$. This circuitry is common to all phase detectors. In addition, however, the phase detector 16 may include circuitry providing parasitics, i.e., non-ideal effects. For example, these parasitic effects can be output signals which are delayed in time and/or phase and amplitude changes which are a function of the frequency of input signals.

To modulate the output signal from the phase locked loop, a modulation signal is applied to two points in the loop. The modulation signal is directly added to the controlled input signal to the voltage controlled oscillator by means of a first adder 20. In addition, the modulation signal is preshaped to compensate for the transfer function of phase locked loop by a modulation compensator 22. This preshaped modulation signal is summed with the output signal from the phase detector by means of a second adder 24.

A phase locked loop such as that illustrated in FIG. 1 has an open loop transfer function $H(\omega)$ which is defined as $$H(\omega) = \frac{K \cdot F(\omega) \cdot G(\omega)}{j\omega}$$

wherein $F(\omega)$ is the transfer function of the low pass filter 18, $G(\omega)$ is the transfer function of the phase detector parasitic effects as well as those of any other loop circuitry located ahead of the second adder 24 which can affect the closed loop transfer response, and K is the loop gain constant which is defined as $$K = \frac{K_v K_\phi}{N}$$

where $K_v$ is the gain constant of the voltage controlled oscillator 10, $K_\phi$ is the gain constant of the phase detector 16 and N is the modulus of the divide-by-N counter 14.

The closed loop transfer function, as seen at the ideal phase detector, is therefore equal to $$\frac{H(\omega)}{H(\omega) + 1}, \text{ or } \frac{K \cdot F(\omega) \cdot G(\omega)}{K \cdot F(\omega) \cdot G(\omega) + j\omega}.$$

The closed loop transfer function, as seen at the input terminal to the voltage controlled oscillator 10, i.e., at the adder 20, is equal to $$\frac{1}{H(\omega) + 1}, \text{ or } \frac{j\omega}{(K \cdot F \cdot (\omega) \cdot G(\omega)) + j\omega}.$$

Adding these two closed loop transfer functions together, it can be seen that the frequency modulation response of the phase locked loop will be linear for all frequencies when the modulation signal applied to the input terminal of the voltage controlled ocsillator 10 is preshaped by the transfer function $$\frac{K \cdot F(\omega) \cdot G(\omega)}{j\omega} + 1.$$

Since any modulation input signal which is applied to the phase locked loop at the second adder 24 will be passed on to the first adder 20 as the input function multiplied by the transfer function $F(\omega)$ of the loop filter, it can therefore be seen that the condition for perfect linearity of the modulation response is satisfied if the modulation signal is applied to the first adder 20 and simultaneously to the second adder 24 modified by the compensator function $$\frac{K \cdot G(\omega)}{j\omega}$$

From the foregoing, it can be seen that the proposed solution of the previously discussed Enderby et al patent, wherein the modulation signal applied to the second adder 24 is compensated by the transfer function $K/j\omega$, is applicable only when the transfer function $G(\omega)$ is assumed to be unity. Thus, that proposed solution is limited in scope since it can only be used with phase locked loops employing phase detectors having no significant parasitic effects. If the phase detector does have significant parasitic effects, the proposed solution of the Enderby patent will not provide linear modulation response throughout the frequency range of interest.

Figure 2A:
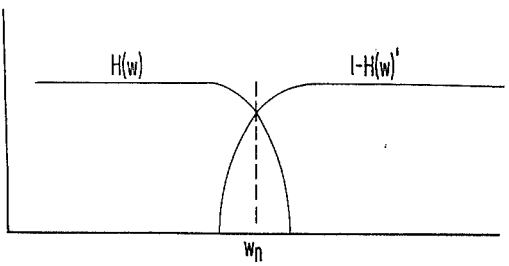
FIGS. 2A and 2B are graphs illustrating the transfer functions of the modulation response of the phase locked loop.

Further explanation of the drawbacks presented by the parasitic effects of the phase detector will now be given with reference to FIGS. 2a and 2b, wherein the transfer function of the loop modulation response is illustrated. As discussed previously, the modulation response of the phase locked loop for a modulation signal applied to the second adder 24 has a transfer function $H(\omega)$ which is substantially flat for lower frequencies, but which decreases rapidly at approximately the natural frequency $\omega_n$ of the loop. The transfer function for the modulation signal which is summed with the control input signal to the voltage controlled oscillator 10 by means of the adder 20 is substantially flat for the higher frequencies and drops off rapidly at approximately the natural frequency $\omega_n$ of the loop. This latter transfer function is approximately equal to the complement of the transfer function $H(\omega)$ for modulation signals applied to the second adder 24, and is illustrated in FIG. 2a as $1-H(\omega)'$.

Figure 2B:
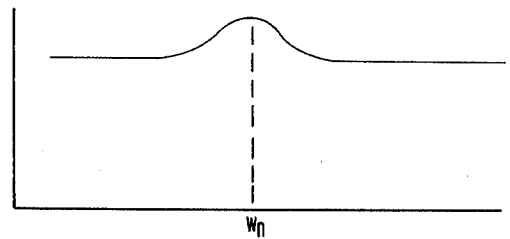

When both modulation signals are simultaneously applied to the phase locked loop the two modulation response transfer functions are effectively added to one another, producing a net transfer response such as that illustrated in FIG. 2b. It can be seen that this transfer response is substantially flat for low and high frequencies, but is non-linear in the mid-frequency range surrounding the natural frequency $\omega_n$ of the loop. This non-linearity is due to the uncompensated parasitic effects of the phase detector 16.

Figure 3:
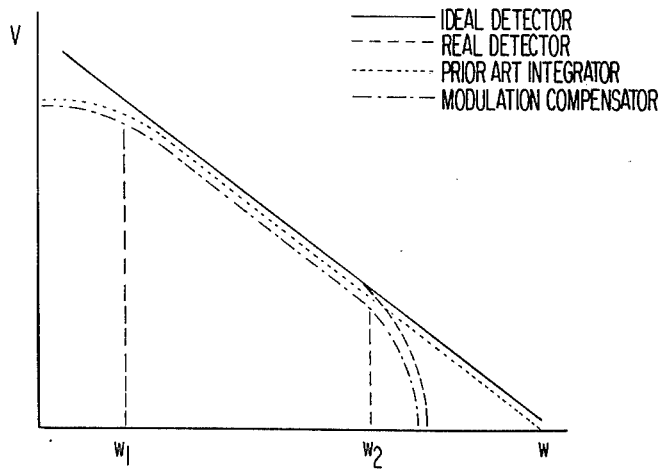
FIG. 3 is a graph illustrating the frequency versus voltage characteristics of ideal and real phase detectors, the modulation compensation circuit of the prior art and the modulation compensation circuit of the present invention.

Referring now to FIG. 3, the gain versus frequency characteristics of a phase detector, or integrator, are illustrated. The solid line in FIG. 3 represents the characteristics of an ideal phase detector or integrator having no parasitic affects. The characteristics of a real phase detector, i.e., a detector having some significant parasitic affects, are represented by the dashed line. It can be seen that the characteristics of the real phase detector begin to deviate from ideal at a frequency $\omega_2$ determined by its actual design. The deviation of the integrator from the ideal results in non-linear modulation response for frequencies near $\omega_2$.

The characteristics of the prior art modulation compensator which utilizes only an integrator are represented by the dotted line. It can be seen that these characteristics closely match the characteristics of an ideal phase detector, except for deviations from ideal occurring at frequencies below the lower cut-off frequency $\omega_1$. This lower cut-off frequency is determined by the components and the complexity of the integrator. Furthermore, it can be seen that the prior art modulation compensator consisting only of an integrator matches the characteristics of a real phase detector having significant parasitic effects only through the frequency range from the lower cut-off frequency $\omega_1$ to the frequency $\omega_2$. The prior art integrator is not able to compensate for the non-ideal characteristics of the real phase detector.

The characteristics of a modulation compensator constructed in accordance with the present invention are illustrated in FIG. 3 by the dot and dashed line. It can be seen that such a modulation compensator has characteristics which closely match those of a real phase detector for all frequencies greater than the lower cut-off frequency $\omega_1$. Therefore, a modulation compensator constructed in accordance with the present invention is able to provide for linear modulation response throughout the operating range of the phase locked loop.

Figure 4:
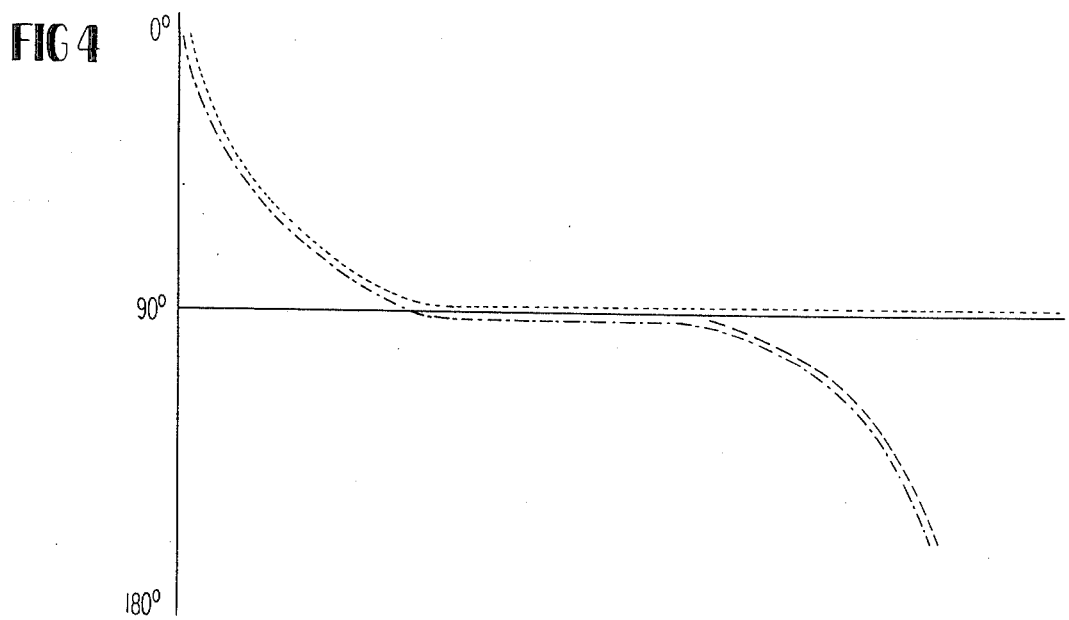
FIG. 4 is a graph illustrating the frequency versus phase shift characteristics of ideal and real phase detectors, the modulation compensation circuit of the prior art and the modulation compensation circuit of the present invention.

A second characteristic of ideal and real phase detectors, i.e., phase shift, is illustrated in the graph of FIG. 4. As represented by the solid line, an ideal phase detector provides the same amount of phase shift, for example 90°, regardless of the frequency of the incoming signal. However, as represented by the dashed line, a real phase detector exhibits a change in phase shift at higher frequencies.

The integrator modulation compensator of the prior art closely matches the characteristics of the ideal phase detector for all frequencies above the lower cut off frequency of the integrator. This results in non-linear modulation response for those frequencies in which the phase shift produced by a real phase detector is a function of input frequency. However, in accordance with the present invention, as illustrated by the dot and dashed line, the characteristics of the modulation compensator closely match those of a real phase detector for all frequencies greater than the lower cut off frequency of the modulation compensator, thus resulting in a linear modulation response through the mid-frequency range.

Figure 5:
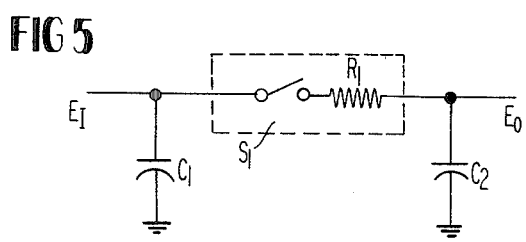
FIG. 5 is a schematic circuit diagram of one embodiment of a phase detector.

A practical application of the present invention will now be explained with reference to FIGS. 5-8. Referring to FIG. 5, a sample-and-hold type of phase detector is illustrated. The phase detector include a first storage capacitor $C_1$ connected between ground potential and an input terminal at which an input signal $E_I$ is present. A sampling switch $S_1$ and a second storage capacitor $C_2$ are connected in parallel with the first storage capacitor $C_1$. The switch $S_1$ has an internal resistance illustrated as a resistor $R_1$.

Figure 6:
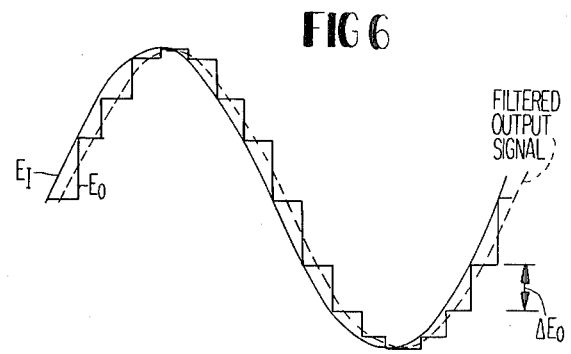
FIG. 6 is a graph illustrating the relationship of the input and output signals of the phase detector of FIG. 5.

In the operation of the phase detector, an input signal $E_1$ is applied to the input terminal of the detector. The detector can have a 240 $\mu$s reference period and the sampling switch $S_1$ is closed for 13 microseconds during each reference period. An output signal $E_o$ appearing at the junction of the switch $S_1$ and the second storage capacitor $C_2$ is a step approximation of the input signal, updated every 240 microseconds, as illustrated in FIG. 6. This output signal $E_o$ is filtered to produce an output signal such as that represented by the dashed line in FIG. 6. Further details of this phase detector and its operation can be found in U.S. Patent Application Ser. No. 852,676 filed Nov. 18, 1977 and now U.S. Pat. No. 4,151,473.

Due to the operation of the phase detector, the filtered output signal is inherently delayed from the input signal by 120 microseconds. This time delay comprises one major parasitic effect of the sample-and-hold type of phase detector.

A second parasitic effect of this type of phase detector is due to the fact that each output sample $\Delta E_o$ is only a partial replica of the change in input signal, $\Delta E_I$, which occurs during the previous reference period. The relationship between the sample and the change in input signal can be expressed as $$\Delta E_o = \Delta E_I \frac{C_3}{C_2}[1 - \exp(-t_s/R_1 C_3)]$$

wherein $C_3 = \frac{C_1 C_2}{C_1 + C_2}$, and $t_s =$ the sample period (e.g., 13 microseconds).

In accordance with the present invention, either or both of these parasitic effects of the sample and hold phase detector can be compensated by preshaping the modulation signal prior to application of the signal to the adder 24 illustrated in the phase locked loop of FIG. 1. For example, the first parasitic effect can be precisely compensated for by including a time delay circuit in the compensator to provide a time delay equal to that produced in the phase detector.

The second parasitic effect of the sample-and-hold phase detector can be compensated by including an RC low-pass filter in the modulation compensator to produce the same phase shift in the modulation signal at a particular frequency where best compensation is desired. For example, this frequency may be the frequency at which the greatest deviation in the modulation response occurs, e.g., the natural frequency $\omega_n$ of the phase locked loop. A modulation compensator including such a low pass filter is illustrated in FIG. 7.

Figure 7:
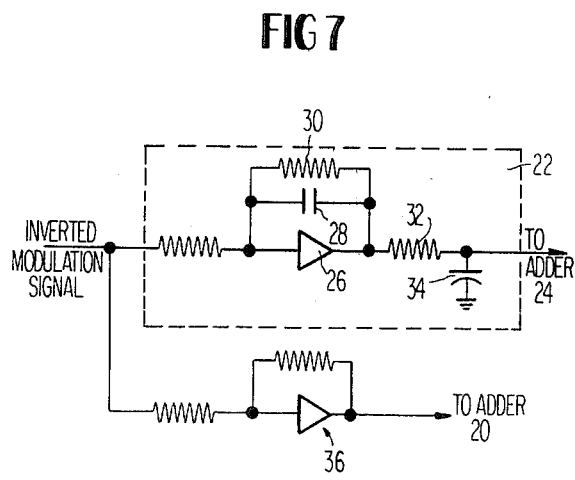
FIG. 7 is a schematic circuit diagram of a first embodiment of a modulation compensation circuit constructed in accordance with the present invention.

Referring now to FIG. 7, the modulation signal is inverted and applied to the modulation compensator circuit 22. The compensator circuit 22 includes an integrator comprising an operational amplifier 26 having a capacitor 28 and a resistor 30 connected in parallel in the feedback circuit of the amplifier. The value of the resistor 30 is chosen to provide adequately linear response at the lowest frequency of interest, i.e., $\omega_1$. The modulation compensation circuit 22 also includes a low-pass filter comprising a resistor 32 connected in series with the output terminal of the operational amplifier 26 and a capacitor 34 connected between the resistor 32 and ground potential. The values of the resistor 32 and capacitor 34 are chosen to provide the closest possible approximation of the transfer function, $G(\omega)$, of the parasitic effects of the phase detector.

The inverted modulation signal is also presented to an inverter 36, from which it is applied to the first adder 20 to be summed with the input control signal to the voltage controlled oscillator 10.

In operation, the integrator within the modulation compensation circuit 22 processes the incoming modulation signal according to the transfer function $K/j\omega$, and the low-pass filter processes the thus integrated signal according to the transfer function $G(\omega)$ of the parasitic effects of the phase detector. Thus, the output signal which is presented to the second adder 24 meets the previously mentioned criterion for modulation compensation and provides for linear modulation response throughout the desired frequency range.

In many applications, the approximation of the transfer function $G(\omega)$ which can be obtained through the use of an RC low-pass filter will be sufficient to provide adequate linearity throughout the frequency range of interest. Furthermore, the RC low-pass filter may provide response characteristics which best fit those of the phase detector within economic and other practical considerations. However, in some applications it may be necessary to provide a more exact approximation of the transfer function $G(\omega)$ than that which can be provided by the RC low-pass filter. Under these conditions, the modulation compensator circuit 22 can include a sampling gate which is constructed with components having the same relative values as those of the phase detector itself. Such a modulation compensator circuit is illustrated in FIG. 8.

In addition to the integrator comprised of the operational amplifier 26 and the parallel connected capacitor 28 and resistor 30, the modulation compensation circuit includes a sampling gate having a pair of alternate action sampling switches 38, 40. The first switch 38 of the alternate action switches is normally closed and the second switch 40 is normally opened. When the second sampling switch 40 is closed during the sampling period, the first switch 38 is opened.

The sampling gate also includes a pair of storage capacitors 42, 44 which are connected between the second sampling switch 40 and ground potential in the same fashion as the storage capacitors $C_1$ and $C_2$ of the phase detector illustrated in FIG. 5. In addition, the storage capacitors 42 and 44 have the same component values as the storage capacitors $C_1$ and $C_2$, respectively. The second sampling switch 40 has an internal resistance equal to that of the switch $S_1$ in the phase detector, or an additional resistor 46 can be added to the sampling gate to compensate for the internal resistance of the sampling switch $S_1$. In the modulation compensator circuit illustrated in FIG. 8, the resistor 30 in the feedback path of the integrator preferably has the highest practical value which can be used within the circuit.

Figure 8:
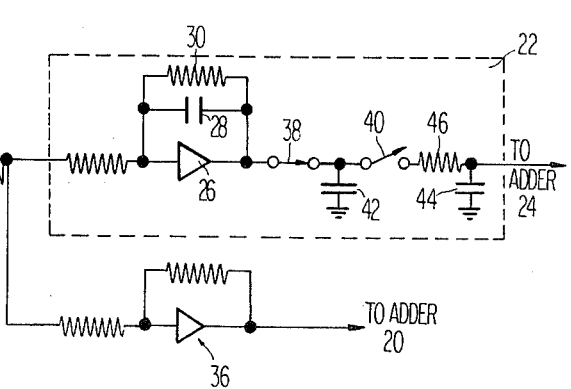
FIG. 8 is a schematic circuit diagram of a second embodiment of a modulation compensation circuit constructed in accordance with the present invention.

In operation, the modulation compensator circuit 22 illustrated in FIG. 8 provides for substantially exact compensation of the transfer function $G(\omega)$ of the parasitic effects of the phase detector, since it processes the modulation signal in the same manner as the phase detector processes an input signal.

In addition to providing compensation for the parasitic effects of the phase detector, the modulation compensation circuit of the present invention offers an additional advantage by providing flexibility in the particular junction in the phase locked loop at which the compensated modulation signal can be summed with the loop signal. As noted previously, the prior art modulated phase locked loops require that the processed modulation signal be summed with the output signal of the phase detector. This requirement can present a drawback in that additional pins may have to be added to an integrated circuit to accommodate for the summing of the modulation signal with the loop signal at this point.

However, in accordance with the present invention, it is not necessary that the compensated modulation signal be summed with the output signal from the phase detector prior to the input terminal of the loop filter. For example, the first node available for the application of the compensated modulation signal may be located after the point at which loop filtering begins. The loop filtering which occurs prior to this node may introduce additional parasitic effects upon the modulation response of the loop. In such a case, the modulation compensation circuit can be configured so as to include circuitry which compensates for these additional parasitic effects as well as for the parasitic effects of the phase detector. The transfer function G(ω) which is considered in the design of the modulation compensator circuit can take into account not only the parasitic effects of the phase detector but also those effects introduced by the loop filtering which occur prior to the summing of the modulation signal.

The present invention may be embodied in other specific forms without departing from the spirit or essential characteristics thereof. The presently disclosed embodiments are therefore considered in all aspects as illustrative and not restrictive. The scope of the invention is indicated by the appended claims rather than the foregoing description, and all changes which come within the meaning and range of equivalency of the claims are therefore intended to be embraced therein.

What is claimed is:

1. A method of modulating a phase-locked loop to provide linear frequency modulation over an extended frequency range, said loop having a voltage controlled oscillator, a phase detector for comparing an output signal of the voltage controlled oscillator with a reference signal and for producing an output signal related to the difference in a component of the two compared signals, and a low-pass filter for processing the output signal of the phase detector and applying the processed signal as a control input signal to the voltage controlled oscillator to control the frequency of an output signal from said oscillator, said method comprising the steps of:

providing a modulation signal;

summing the modulation signal with the control input signal to thereby directly apply the modulation signal to the voltage controlled oscillator as an input signal;

providing a summing junction in the phase-locked loop at a point located between the output terminal of the phase detector and the output terminal of the low-pass filter;

preshaping the modulation signal to compensate for the transfer function of ideal and any non-ideal loop circuitry located between the output terminal of the voltage controlled oscillator and the summing junction; and applying the preshaped modulation signal to the summing junction to thereby add said preshaped modulation signal to the loop signal present at said summing junction.

2. The method of claim 1 wherein said preshaping step includes the step of producing a phase shift in the modulation signal equal to the phase shift produced by the phase detector.

3. The method of claim 1 wherein said preshaping step includes the step of processing the modulation signal in a manner substantially equal to the manner in which an input signal is processed in the phase detector.

4. The method of claim 1 wherein said phase detector is of the sample-and-hold type and wherein said preshaping step includes sampling the modulation signal in the same manner as that in which an input signal is sampled in said phase detector.

5. A phase-locked loop circuit providing linear frequency modulation over an extended frequency range, comprising:

a source of a reference signal;

a voltage controlled oscillator;

a phase detector for comparing a component of the reference signal with a component of the output signal from said voltage controlled oscillator and for producing an output signal related to the difference between the compared components of the two signals;

a low-pass filter for processing the output signal of said phase detector and applying the processed signal as a control input signal to said voltage controlled oscillator to control the frequency of the output signal from said voltage controlled oscillator;

a source of a modulation signal;

means for summing the modulation signal with the control input signal to thereby directly apply the modulation signal to the voltage controlled oscillator as an input signal;

a summing junction located within said phase-locked loop at a point between an output terminal of said phase detector and an output terminal of said low-pass filter;

means for compensating the modulation signal for the transfer function of the phase locked loop, including means for preshaping the modulation signal to compensate for the transfer function of ideal and any non-ideal loop circuitry located between the output terminal of said voltage controlled oscillator and said summing junction; and means for applying the preshaped modulation signal to said summing junction to thereby add the preshaped modulation signal to the loop signal present at said summing junction.

6. The phase-locked loop circuit of claim 5 wherein said preshaping means includes means for delaying the modulation signal.

7. The phase-locked loop circuit of claim 5 wherein said preshaping means includes an RC low-pass network for producing a phase shift in the modulation signal equal to the phase shift produced by the loop circuitry located between the output terminal of the voltage controlled oscillator and the summing junction.

8. The phase-locked loop circuit of claim 5 wherein said preshaping means includes means for processing the modulation signal in a manner substantially identical to the manner in which a signal is processed in said phase detector.

9. The phase-locked loop circuit of claim 5 wherein said phase detector is of the sample-and-hold type, and wherein said preshaping means includes a sampling gate for sampling the modulation signal in the same manner as that in which an input signal is sampled in said phase detector.

* * * * *